(12) United States Patent
Wang et al.

(10) Patent No.: US 7,743,494 B2
(45) Date of Patent: Jun. 29, 2010

(54) PROCESS OF FABRICATING A CIRCUIT BOARD

(75) Inventors: Alan E. Wang, Pittsburgh, PA (US); Kevin C. Olson, Wexford, PA (US); Michael J. Pawlik, Glenshaw, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 11/972,671

(22) Filed: Jan. 11, 2008

(65) Prior Publication Data

US 2009/0178838 A1 Jul. 16, 2009

(51) Int. Cl.
*H01K 3/10* (2006.01)

(52) U.S. Cl. .................... 29/852; 29/830; 174/262; 216/19; 427/97.7

(58) Field of Classification Search .......... 29/846, 29/852, 830, 848, 853; 156/89.15, 89.16; 174/262, 264; 216/17, 19, 20; 361/748; 427/97.2, 97.7, 405; 428/209, 210, 457, 428/901

See application file for complete search history.

(56) References Cited

U.S. PATENT DOCUMENTS

| 3,873,756 | A | * | 3/1975 | Gall et al. ............ 174/262 |
|---|---|---|---|---|
| 4,303,715 | A | | 12/1981 | Chang |
| 4,712,161 | A | | 12/1987 | Pryor et al. |
| 4,894,271 | A | * | 1/1990 | Hani et al. ............ 428/209 |
| 4,938,999 | A | * | 7/1990 | Jenkin ............ 427/405 |
| 5,098,533 | A | | 3/1992 | Duke et al. |
| 5,282,312 | A | | 2/1994 | DiStefano et al. |
| 5,863,447 | A | * | 1/1999 | Coteus et al. ............ 216/17 |
| 6,388,208 | B1 | | 5/2002 | Kiani et al. |
| 6,713,587 | B2 | | 3/2004 | McCollum et al. |
| 6,951,707 | B2 | | 10/2005 | Wang et al. |
| 7,000,313 | B2 | | 2/2006 | McCollum et al. |
| 2005/0124196 | A1 | | 6/2005 | Olson et al. |
| 2006/0213685 | A1 | | 9/2006 | Wang et al. |

* cited by examiner

*Primary Examiner*—Donghai D. Nguyen
(74) *Attorney, Agent, or Firm*—Diane R. Meyers

(57) ABSTRACT

A process for fabricating a circuit board includes: providing a substrate including a first electrically conductive core having a first insulating coating on a first side and a second insulating coating on a second side, forming an opening in the first and second insulating coatings and the first electrically conductive core, exposing an edge of the conductive core within the opening, and electrodepositing a third insulating material on the exposed edge of the first electrically conductive core. A circuit board fabricated using the process is also provided.

37 Claims, 4 Drawing Sheets

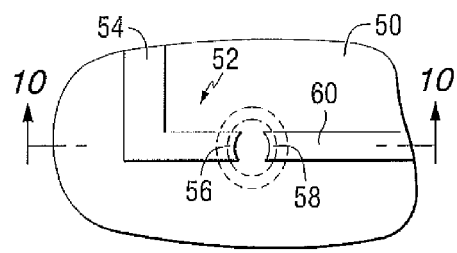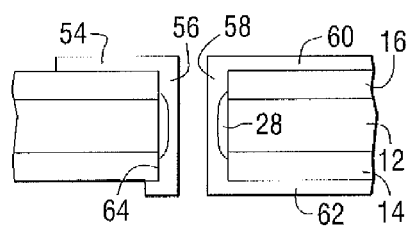
FIG. 9　　　FIG. 10
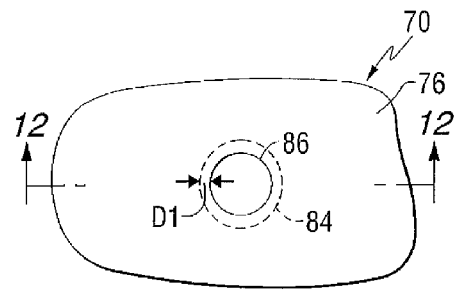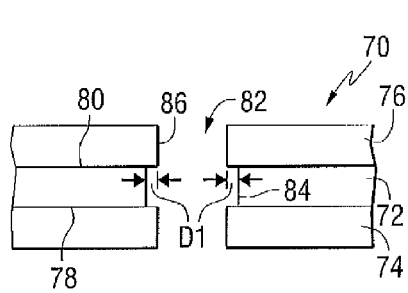
FIG. 11　　　FIG. 12
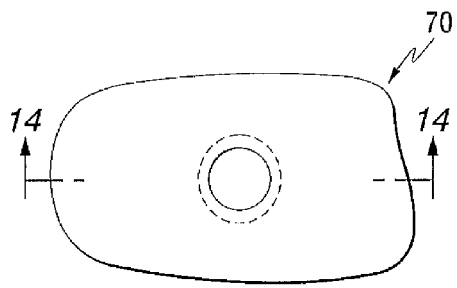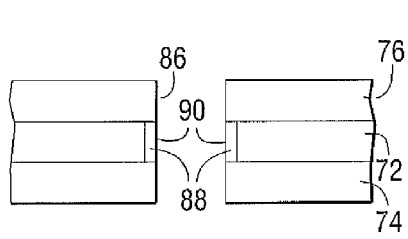
FIG. 13　　　FIG. 14
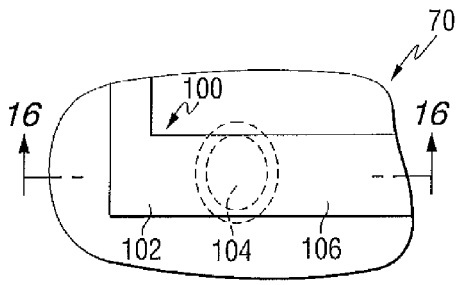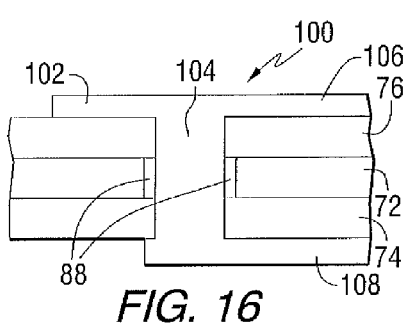
FIG. 15　　　FIG. 16

PROCESS OF FABRICATING A CIRCUIT BOARD

FIELD OF THE INVENTION

The present invention relates to the field of electronic circuitry, and in particular to assemblies such as chip scale packages, and the preparation thereof.

BACKGROUND OF THE INVENTION

In microelectronic circuit packages, circuits and units are prepared in packaging levels of increasing scale. Generally, the smallest scale packaging levels are typically semiconductor chips housing multiple microcircuits and/or other components. Such chips are usually made from ceramics, silicon, and the like. Intermediate package levels (i.e., "chip carriers") comprising multi-layer substrates may have attached thereto a plurality of small-scale chips housing many microelectronic circuits. Likewise, these intermediate package levels themselves can be attached to larger scale circuit cards, motherboards, and the like. The intermediate package levels serve several purposes in the overall circuit assembly including structural support, transitional integration of the smaller scale microcircuits and circuits to larger scale boards, and the dissipation of heat from the circuit assembly. Substrates used in conventional intermediate package levels have included a variety of materials, for example, ceramic, fiberglass reinforced polyepoxides, and polyimides.

Electrical components, for example, resistors, transistors, and capacitors, are commonly mounted on circuit panel structures such as printed circuit boards. Circuit panels ordinarily include a generally flat sheet of dielectric material with electrical conductors disposed on a major, flat surface of the sheet, or on both major surfaces. The conductors are commonly formed from metallic materials such as copper and serve to interconnect the electrical components mounted to the board. Where the conductors are disposed on both major surfaces of the panel, the panel may have via conductors extending through holes (or "through vias") in the dielectric layer so as to interconnect the conductors on opposite surfaces. Multi-layer circuit panel assemblies have been made heretofore which incorporate multiple stacked circuit panels with additional layers of dielectric materials separating the conductors on mutually facing surfaces of adjacent panels in the stack. These multilayer assemblies ordinarily incorporate interconnections extending between the conductors on the various circuit panels in the stack as necessary to provide the required electrical interconnections.

Generally multi-layer panels are made by providing individual, dual sided circuit panels including appropriate conductors. The panels are then laminated one a top the other with one or more layers of uncured or partially cured dielectric material, commonly referred to as "prepregs" disposed between each pair of adjacent panels. Such a stack ordinarily is cured under heat and pressure to form a unitary mass. After curing, holes typically are drilled through the stack at locations where electrical connections between different boards are desired. The resulting holes or "through vias" are then coated or filled with electrically conductive materials usually by plating the interiors of the holes to form a plated through via.

There has been an increasing need for circuit panel structures, which provide high density, complex interconnections.

SUMMARY OF THE INVENTION

In one aspect, the invention provides a process for fabricating a circuit board including: providing a substrate including a first electrically conductive core having a first insulating coating on a first side and a second insulating coating on a second side, forming an opening in the first and second insulating coatings and the first electrically conductive core, exposing an edge of the conductive core within the opening, and electrodepositing a third insulating material on the exposed edge of the first electrically conductive core.

In another aspect, the invention provides a circuit board including a substrate including a first electrically conductive core having a first insulating coating on a first side and a second insulating coating on a second side, an opening in the first and second insulating coatings and the first electrically conductive core, exposing an edge of the conductive core within the opening, and an electrodeposited third insulating material on the exposed edge of the first electrically conductive core.

BRIEF DESCRIPTION OF THE DRAWINGS

FIG. 9 is a cross-sectional view of the substrate of FIG. 8, taken along line 9-9.

FIG. 10 is a plan view of the substrate with a recessed edge of the core.

FIG. 11 is a cross-sectional view of another substrate of FIG. 12, taken along line 12-12.

FIG. 12 is a cross-sectional view of the substrate of FIG. 11, taken along line 12-12.

FIG. 13 is a plan view of the substrate of FIG. 11 including a dielectric coating on an edge of a conductive core.

FIG. 14 is a cross-sectional view of the substrate of FIG. 13, taken along line 13-13.

FIG. 15 is a plan view of a circuitized substrate.

FIG. 16 is a cross-sectional view of the substrate of FIG. 15, taken along line 16-16.

DETAILED DESCRIPTION OF THE INVENTION

In one aspect, the invention is directed to a process for fabricating a circuit substrate including an electrically conductive core and one or more vias extending through the core.

Figure 1:
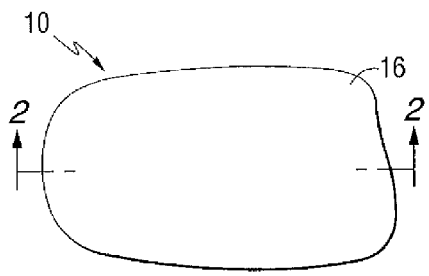
FIG. 1 is a plan view of a substrate.
Figure 2:
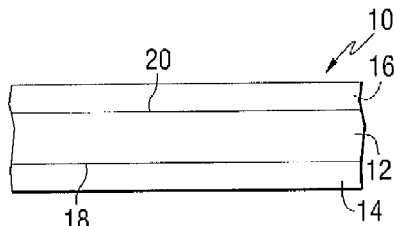
FIG. 2 is a cross-sectional view of the substrate of FIG. 1, taken along line 2-2.

FIG. 1 is a plan view of a substrate 10. FIG. 2 is a cross-sectional view of the substrate of FIG. 1, taken along line 2-2. The substrate 10 includes an electrically conductive core 12 and first and second layers of electrically insulating dielectric material 14 and 16 on opposite major surfaces 18 and 20 of the core.

The core can be fabricated from any of a plurality of electrically conductive materials, such as a metal, for example, untreated or galvanized steel, aluminum, gold, nickel, copper, magnesium or alloys of any of the foregoing metals, as well as conductive carbon coated materials. In one aspect, the core has a thickness ranging from about 10 μm to about 100 μm, typically from about 25 μm to about 100 μm.

In another embodiment, the core comprises a nickel-iron alloy. A preferred iron-nickel alloy is INVAR™, comprising approximately 64 weight percent iron and 36 weight percent nickel. This alloy has a low coefficient of thermal expansion, comparable to that of silicon materials used to prepare chips. This property is desirable in order to prevent failure of adhesive joints between successively larger or smaller scale layers of a chip scale package, due to thermal cycling during normal use.

Prior to the application of the insulating coatings, a layer of metal, usually copper, may be applied to the core to ensure optimum electrical conductivity. This layer of metal, as well as that applied in subsequent metallization steps, can be applied by conventional means, for example, by electroplating, metal vapor deposition techniques, and electroless plating. The layer of metal typically has a thickness of from about 1 to about 10 μm.

In one embodiment of the present invention, the substrate comprises a perforate core comprised of any of the previously mentioned metals or combinations thereof. That is, the core can be a sheet of any of the aforementioned substrate materials, wherein only a portion of core, or all of the core is perforated.

Typically the holes (or vias) are of uniform size and shape. When the holes are circular, which is typical, the diameter of the holes is about 8 mil (203.2 microns). In a perforate substrate, the holes may be larger or smaller as necessary. The spacing of the holes can be about 20 mils (508 microns) center-to-center, but again may be larger or smaller as necessary.

The dielectric coatings used for layers 14 and 16 can be formed from any of a variety of coating compositions as discussed below. The dielectric coatings can be formed from a thermoplastic composition where, once applied, solvents (i.e., organic solvents and/or water) are driven off or evaporated, thereby forming a film of the dielectric coating on the substrate. The dielectric coatings can also be formed from a curable or thermosetting composition where once the composition is applied to the substrate and cured, a cured film of the dielectric coating is formed. The dielectric coatings can be any coating applied by any coating application technique provided that the resultant coating has a sufficiently low dielectric constant to ensure sufficient insulating properties, and flame resistance properties.

The dielectric coating may also be applied by any suitable conformal coating method including, for example, dip coating, vapor deposition, electrodeposition and autophoresis. Examples of dielectric coatings applied by vapor deposition include poly-(para-xylylenes) (encompassing both substituted and unsubstituted poly-(para-xylylene)); silsesquioxanes; poly-benzocyclobutene and polyimide.

Examples of dielectric coatings applied by electrodeposition include anodic and cathodic acrylic, epoxy, polyester, polyurethane, polyimide or oleoresinous compositions, as are well known to those skilled in the art. The dielectric coating also can be formed by the electrodeposition of an electrodepositable photosensitive composition.

Also, prior to application of the dielectric coating, the substrate surface may be pretreated or otherwise prepared for the application of the dielectric material. For example, cleaning, rinsing, and/or treatment with an adhesion promoter prior to application of the dielectric may be appropriate.

Figure 3:
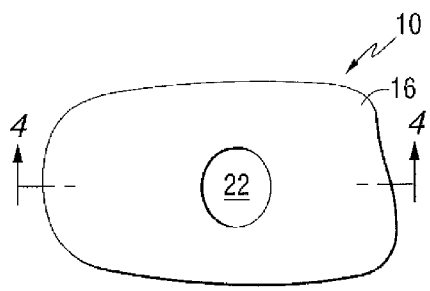
FIG. 3 is a plan view of the substrate including an opening.
Figure 4:
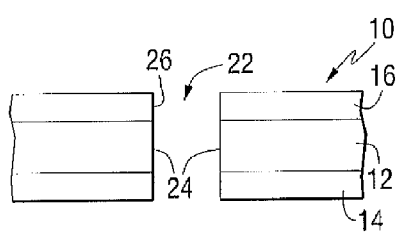
FIG. 4 is a cross-sectional view of the substrate of FIG. 3, taken along line 4-4.

FIG. 3 is a plan view of the substrate 10 including an opening 22 passing through the substrate. FIG. 4 is a cross-sectional view of the substrate of FIG. 3, taken along line 4-4. The opening can be created after application of the insulating layers using any known technique, including mechanical drilling, laser drilling, chemical etching, dry plasma etching of the insulating layers followed by chemical etching of the core, etc. The opening may have a circular cross-sectional shape with a diameter of for example, about 25 μm, or another cross-sectional shape. The opening may alternatively be present in the core prior to the application of the insulating coatings, with any insulating coating in the opening being subsequently removed. In either case, the opening exposes an edge 24 of the conductive core. In this example, the edge is aligned with the wall 26 of the opening.

Circuitry on one surface of the substrate can be electrically connected to circuitry on an opposite surface of the substrate by a conductor that passes through the opening. The conductor can completely fill the opening, or partially fill the opening, or be positioned along a side of the opening. In any case, it may be desirable to prevent an electrical connection between the core and the conductor in the opening. In one aspect, this invention provides a method of insulating the core from a conductor in the opening. Prior methods of depositing insulating material in the opening have resulted in plugging the opening, when the diameter of the openings was below for example, 200 microns. Such plugging prevents the subsequent formation of a conductor in the opening, without first removing some of the insulating material from the plugged opening. This invention provides a method that allows for the deposition of an insulating material within small diameter holes, without excessive plugging. Such diameters can be less than or equal to 200 microns, or in another example, less than or equal to 150 microns in a 50 micron core.

Figure 5:
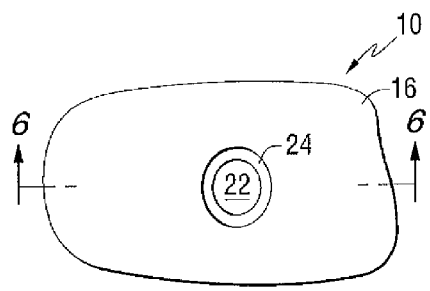
FIG. 5 is a plan view of the substrate including a dielectric coating on an edge of a conductive core.
Figure 6:
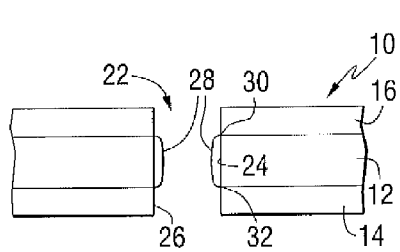
FIG. 6 is a plan view of a circuitized substrate.

A dielectric coating can then be applied to the exposed edge of the core. FIG. 5 is a plan view of the substrate including a dielectric coating 28 on an edge of a conductive core. FIG. 6 is a cross-sectional view of the substrate of FIG. 5, taken along line 6-6. By using an electrodeposition process, only the exposed portions of the core will be coated. In this example, only the edges of the core within the opening are coated.

In one example, the dielectric-metal core-dielectric structure may be patterned directly by traditional means or by laminating a patterned metal core and then opening up the dielectric in the patterned areas. In these cases, the metal core would still be exposed in the vias. A conformal electrodeposited coating that could flow into the via and sufficiently insulate the exposed metal core areas would be used.

In one embodiment, the electrodeposited coating dielectric can be applied at the exposed edges of a patterned dielectric-metal core-dielectric substrate. This could be done on a substrate where a dielectric-metal core-dielectric is patterned directly by traditional means or by laminating a patterned metal core and then opening up the dielectric in the patterned areas.

In a particular embodiment of the invention, the dielectric coating is applied to the substrate by electrodeposition of an electrodepositable coating. The coating composition may include a resinous phase dispersed in an aqueous medium, where the resinous phase has a covalently bonded halogen content of at least 1 percent by weight based on total weight of resin solids present in said resinous phase.

A wide variety of electrodepositable film-forming polymers are known and can be used in the electrodepositable coating compositions of the present invention so long as the polymers are "water dispersible," i.e., adapted to be solubilized, dispersed or emulsified in water. The water dispersible polymer is ionic in nature, that is, the polymer can contain anionic functional groups to impart a negative charge or cationic functional groups to impart a positive charge. In a particular embodiment of the present invention, the resin (a) comprises cationic salt groups, usually cationic amine salt groups.

Non-limiting examples of film-forming resins suitable for use as the resin (a) in anionic electrodepositable coating compositions include base-solubilized, carboxylic acid group-containing polymers such as the reaction product or adduct of a drying oil or semi-drying fatty acid ester with a dicarboxylic acid or anhydride; and the reaction product of a fatty acid ester, unsaturated acid or anhydride and any additional unsaturated modifying materials which are further reacted with polyol. Also suitable are the at least partially neutralized interpolymers of hydroxy-alkyl esters of unsaturated carboxylic acids, unsaturated carboxylic acid and at least one other ethylenically unsaturated monomer. Still another suitable electrodepositable resin comprises an alkyd-aminoplast vehicle, i.e., a vehicle containing an alkyd resin and an amine-aldehyde resin. Another suitable anionic electrodepositable resin composition comprises mixed esters of a resinous polyol. Other acid functional polymers can also be used such as phosphatized polyepoxide or phosphatized acrylic polymers as are well known to those skilled in the art. Additionally, suitable for use as the resin (a) are those resins comprising one or more pendent carbamate functional groups.

In one particular embodiment of the present invention, the active hydrogen-containing ionic electrodepositable resin (a) is cationic and capable of deposition on a cathode. Non-limiting examples of such cationic film-forming resins include amine salt group-containing resins such as the acid-solubilized reaction products of polyepoxides and primary or secondary amines. Usually, these amine salt group-containing resins are used in combination with a blocked isocyanate curing agent as described in detail below. The isocyanate can be fully blocked or the isocyanate can be partially blocked and reacted with the resin backbone. Also, one-component compositions can be used in the electrodepositable coating compositions of the present invention as the resin (a). Besides the epoxy-amine reaction products discussed immediately above, the resin (a) can also be selected from cationic acrylic resins.

Besides amine salt group-containing resins, quaternary ammonium salt group-containing resins can also be employed. Examples of these resins include those which are formed from reacting an organic polyepoxide with a tertiary amine salt. Examples of other cationic resins are ternary sulfonium salt group-containing resins and quaternary phosphonium salt group-containing resins. Also, film-forming resins which cure via transesterification can be used. Further, cationic compositions prepared from Mannich bases can be used.

In one embodiment of the present invention, the resin (a) can comprise one or more positively charged resins which contain primary and/or secondary amine groups. In one example, a polyketimine derivative of a polyamine such as diethylenetriamine or triethylenetetramine is reacted with a polyepoxide. When the reaction product is neutralized with acid and dispersed in water, free primary amine groups are generated. Also, equivalent products are formed when polyepoxide is reacted with excess polyamines such as diethylenetriamine and triethylenetetramine and the excess polyamine vacuum stripped from the reaction mixture.

Mixtures of the above-described ionic resins also can be used advantageously. In one embodiment of the present invention, the resin (a) comprises a polymer having cationic salt groups and is selected from a polyepoxide-based polymer having primary, secondary and/or tertiary amine groups (such as those described above) and an acrylic polymer having hydroxyl and/or amine functional groups.

As previously discussed, in one particular embodiment of the present invention, the resin (a) comprises cationic salt groups. In this instance, such cationic salt groups typically are formed by solubilizing the resin with an inorganic or organic acid such as those conventionally used in electrodepositable compositions. Suitable examples of solubilizing acids include, but are not limited to, sulfamic, acetic, lactic, and formic acids. Sulfamic and lactic acids are most commonly employed.

Also, as aforementioned, the covalently bonded halogen content of the resinous phase of the electrodepositable coating composition can be derived from halogen atoms covalently bonded to the resin (a). In such instances, the covalently bonded halogen content can be attributed to a reactant used to form any of the film-forming ionic resins described above. For example, in the case of an anionic group-containing polymer, the resin may be the reaction product of a halogenated phenol, for example a halogenated polyhydric phenol such as chlorinated or brominated bisphenol A with an epoxy group-containing material such as those described above with reference to the resin (a) followed by solubilization with phosphoric acid, or alternatively, an epoxy containing compound reacted with a halogenated carboxylic acid followed by reaction of any residual epoxy groups with phosphoric acid. The acid groups can then be solubilized with amine. Likewise, in the case of a cationic salt group-containing polymer, the resin may be the reaction product of an epoxy functional material such as those described above with a halogenated phenol followed by reaction of any residual epoxy groups with an amine. The reaction product can then be solubilized with an acid.

In one embodiment of the present invention, the covalently bonded halogen content of the resin (a) can be derived from a halogenated compound selected from at least one of a halogenated phenol, halogenated polyolefin, halogenated phosphate ester, and mixtures thereof. In another embodiment of the present invention, the covalently bonded halogen content of the resin (a) is derived from a halogenated polyhydric phenol, for example, a chlorinated bisphenol A such as tetrachlorobisphenol A, or a brominated bisphenol A such as tetrabromobisphenol A. Additionally, the covalently bonded halogen content may be derived from a halogenated epoxy compound, for example, the diglycidyl ether of a halogenated bisphenol A.

The active hydrogen-containing ionic electrodepositable resin (a) described above can be present in the electrodepositable coating composition of the present invention in amounts ranging from 5 to 90 percent by weight, usually 10 to 80 percent by weight, often 10 to 70 percent by weight, and typically 10 to 60 percent by weight based on total weight of the electrodepositable coating composition.

As mentioned above, the resinous phase of the electrodepositable coating composition of the present invention further comprises (b) a curing agent adapted to react with the active hydrogens of the ionic electrodepositable resin (a) described immediately above. Both blocked organic polyisocyanate and aminoplast curing agents are suitable for use in the present invention, although blocked isocyanates typically are employed for cathodic electrodeposition.

Aminoplast resins, which are common curing agents for anionic electrodeposition, are the condensation products of amines or amides with aldehydes. Examples of suitable amine or amides are melamine, benzoguanamine, urea and similar compounds. Generally, the aldehyde employed is formaldehyde, although products can be made from other aldehydes such as acetaldehyde and furfural. The condensation products contain methylol groups or similar alkylol groups depending on the particular aldehyde employed. Preferably, these methylol groups are etherified by reaction with an alcohol. Various alcohols employed include monohydric alcohols containing from 1 to 4 carbon atoms such as methanol, ethanol, isopropanol, and n-butanol, with methanol being preferred. Aminoplast resins are commercially available from American Cyanamid Co. under the trademark CYMEL and from Monsanto Chemical Co. under the trademark RESIMENE.

The aminoplast curing agents typically are utilized in conjunction with the active hydrogen containing anionic electrodepositable resin in amounts ranging from about 1 to 90 percent by weight, often from 5 to 60 percent by weight, preferably from 20 to 40 percent by weight, the percentages based on the total weight of the resin solids in the electrodepositable coating composition.

The curing agents commonly employed in cathodic electrodeposition compositions are blocked polyisocyanates. The polyisocyanates can be fully blocked, or partially blocked and reacted with the polymer backbone. By "blocked" is meant that the isocyanate groups have been reacted with a compound such that the resultant blocked isocyanate group is stable to active hydrogens at ambient temperature but reactive with active hydrogens in the film forming polymer at elevated temperatures usually between 90° C. and 200° C.

Suitable polyisocyanates include aromatic and aliphatic polyisocyanates, including cycloaliphatic polyisocyanates and representative examples include diphenylmethane-4,4'-diisocyanate (MDI), 2,4- or 2,6-toluene diisocyanate (TDI), including mixtures thereof, p-phenylene diisocyanate, tetramethylene and hexamethylene diisocyanates, dicyclohexylmethane-4,4'-diisocyanate, isophorone diisocyanate, mixtures of phenylmethane-4,4'-diisocyanate and polymethylene polyphenylisocyanate. Higher polyisocyanates such as triisocyanates can be used. An example would include triphenylmethane-4,4',4'''-triisocyanate. Isocyanate prepolymers with polyols such as neopentyl glycol and trimethylolpropane and with polymeric polyols such as polycaprolactone diols and triols (NCO/OH equivalent ratio greater than 1) can also be used.

The polyisocyanate curing agents typically are utilized in conjunction with the active hydrogen containing cationic electrodepositable resin (a) in amounts ranging from 1 to 90 percent by weight, usually 1 to 80 percent by weight, often 1 to 70 percent by weight, and typically 1 to 15 percent by weight based on total weight of the electrodeposition bath.

Also suitable are beta-hydroxy urethane curing agents. Such beta-hydroxy urethanes are formed from an isocyanate compound, for example, any of those described immediately above, a 1,2-polyol and/or a conventional blocking such as monoalcohol. Also suitable are the secondary amine blocked aliphatic and cycloaliphatic isocyanates.

In one embodiment of the present invention, the curing agent (b) has a covalently bonded halogen content of up to 60 weight percent, and typically ranges from 1 to 50 weight percent, often from 2 to 30 weight percent, usually from 5 to 25 weight percent, and can be from 10 to 20 weight percent based on weight of total resin solids present in the curing agent (b). In such instances, the covalently bonded halogen content present in the curing agent (b) can be derived from, for example, a halogen-containing blocked isocyanate which can be prepared by at least partially blocking 4-chloro-6-methyl-1,3-phenylene diisocyanate with a suitable blocking agent such as 2-butoxy ethanol. If partially blocked, any residual isocyanate groups can be reacted with a polyol such as trimethylolpropane, thereby increasing molecular weight of the curing agent.

As mentioned above, in a further embodiment of the present invention, the covalently bonded halogen content present in the resinous phase of the electrodepositable coating composition can be derived from a component (c) which is different from and present in addition to the resin (a) and the curing agent (b). In such instances, the component (c) typically is a covalently bonded halogen-containing compound selected from the group consisting of halogenated polyolefin, halogenated phosphate ester, halogenated phenol such as any of the halogenated phenols described above and mixtures thereof.

As aforementioned, the covalently bonded halogen content present in the resinous phase of the electrodepositable coating composition can be derived from the resin (a), the curing agent (b) the component (c), or any combination of the foregoing, provided that the covalently bonded halogen content is sufficient to ensure that the resultant electrodeposition coating when electrophoretically applied and cured passes flame resistance testing in accordance with IPC-TM-650 as previously discussed. The covalently bonded halogen content of the resinous phase of the electrodepositable coating composition also should be present in an amount insufficient to adversely affect the electrodeposition process and/or the resulting dielectric coating properties.

In an embodiment of the present invention, the electrodepositable coating composition can further comprise a rheology modifier which can assist in the deposition of a smooth and uniform thickness of the dielectric coating on the surface of the hole or via walls, as well as the edges at the via openings (without obstructing the holes). Any of a variety of the rheology modifiers well-known in the coatings art can be employed for this purpose.

One suitable rheology modifier comprises a cationic microgel dispersion prepared by dispersing in aqueous medium a mixture of a cationic polyepoxide-amine reaction product which contains amine groups, typically primary amine groups, secondary amine groups and mixtures thereof, and a polyepoxide crosslinking agent, and heating the mixture to a temperature sufficient to crosslink the mixture, thus forming a cationic microgel dispersion. Other suitable theology modifiers include the cationic microgel dispersion having a shell-core morphology. This microgel is prepared by emulsification in aqueous medium of a cationic film-forming resin and a thermosetting crosslinking agent, and heating the resultant emulsion to a temperature sufficient to crosslink the two components.

The cationic microgel is present in the electrodepositable coating composition in an amount sufficient to effect adequate rheology control and hole edge coverage, but insufficient to adversely affect flow of the electrodepositable composition upon application or surface roughness of the cured coating. For example, the cationic microgels described immediately above can be present in the resinous phase of the electrodepositable coating composition in an amount ranging from 0.1 to 30 weight percent, typically from 1 to 20 weight percent based on weight of total resin solids present in the resinous phase.

The electrodepositable coating composition is in the form of an aqueous dispersion. The term "dispersion" is believed to be a two-phase transparent, translucent or opaque resinous system in which the resin is in the dispersed phase and the water is in the continuous phase. The average particle size of the resinous phase is generally less than 1.0, usually less than 0.5 microns, and typically less than 0.15 micron.

The concentration of the resinous phase in the aqueous medium is at least 1 and usually from 2 to 60 percent by weight based on total weight of the aqueous dispersion. When the compositions of the present invention are in the form of resin concentrates, they generally have a resin solids content of 20 to 60 percent by weight based on weight of the aqueous dispersion.

Electrodepositable coating compositions typically are supplied as two components: (1) a clear resin feed, which includes, generally, the active hydrogen-containing ionic electrodepositable resin, i.e., the main film-forming polymer, the curing agent, and any additional water-dispersible, non-pigmented components; and (2) a pigment paste, which, generally, includes one or more pigments, a water-dispersible grind resin which can be the same or different from the main-film forming polymer, and, optionally, additives such as catalysts, and wetting or dispersing aids. Electrodepositable coating components (1) and (2) are dispersed in an aqueous medium which comprises water and, usually, coalescing solvents to form an electrodeposition bath. Alternatively, the electrodepositable composition of the present invention can be supplied as a one-component composition. In a particular embodiment of the present invention, the electrodepositable coating composition can be supplied as a substantially pigment-free, one-component composition.

It should be appreciated that there are various methods by which the component (c), when employed, can be incorporated into the electrodepositable coating composition in the form of an electrodeposition bath. The component (c) can be incorporated "neat", that is, the component (c) or an aqueous solution thereof can be added directly to the dispersed electrodeposition composition components (1) and (2), or if applicable, to the dispersed one-component electrodeposition composition. Alternatively, the component (c) can be admixed with or dispersed in the clear resin feed (or any of the individual clear resin feed components, for example the film-forming resin or the curing agent) prior to dispersing components (1) and, if employed (2), in the aqueous medium. Further, the component (c) can be admixed with or dispersed in the pigment paste, or any of the individual pigment paste components, for example, the pigment grind resin prior to dispersing components (1) and (2) in the aqueous medium. Finally the component (c) can be added on-line directly to the electrodeposition bath.

The electrodepositable coating can be in the form of an electrodeposition bath and typically has a resin solids content within the range of 5 to 25 percent by weight based on total weight of the electrodeposition bath.

As aforementioned, besides water, the aqueous medium may contain a coalescing solvent. Useful coalescing solvents include hydrocarbons, alcohols, esters, ethers and ketones. Usual coalescing solvents include alcohols, polyols and ketones. Specific coalescing solvents include isopropanol butanol, 2-ethylhexanol, isophorone, 2-methoxypentanone, ethylene and propylene glycol and glycol ethers such as monoethyl, monobutyl and monohexyl ethers of ethylene glycol. The amount of coalescing solvent is generally between about 0.01 and 25 percent and when used, preferably from about 0.05 to about 5 percent by weight based on total weight of the aqueous medium.

Although typically substantially free of pigment, if desired, a pigment composition and/or various additives such as surfactants, wetting agents or catalyst can be included in the dispersion. The pigment composition may be of the conventional type comprising pigments, for example, iron oxides, strontium chromate, carbon black, titanium dioxide, talc, barium sulfate, as well as color-imparting pigments well known in the art. The electrodeposition bath usually is essentially free of chrome- and/or lead-containing pigments.

The pigment content of the dispersion usually is expressed as a pigment-to-resin ratio. In the practice of the invention, when pigment is employed, the pigment-to-resin ratio is usually within the range of about 0.02 to 1:1. The other additives mentioned above are usually in the dispersion in amounts ranging from 0.01 to 10 percent by weight based on weight of resin solids.

The above electrodepositable coating compositions and methods of application for such compositions are described in detail in U.S. Pat. Nos. 7,000,313 and 6,713,587, the disclosures of which are hereby incorporated by reference.

Any of the previously described electrodepositable coating compositions can be electrophoretically applied to exposed areas of an electroconductive substrate (or substrate that has been rendered electroconductive as by metallization). The applied voltage for electrodeposition may be varied and can be, for example, as low as about 1 volt to as high as several thousand volts, but typically between about 50 and about 500 volts. The current density is usually between about 0.5 ampere and about 5 amperes per square foot (about 0.5 to about 5 milliamperes per square centimeter) and tends to decrease during electrodeposition, indicating the formation of an insulating conformal film on all exposed surfaces of the substrate. After the coating has been applied by electrodeposition, it can be cured. For example, it can be thermally cured at elevated temperatures ranging from 90° to 300° C. for a period of 1 to 40 minutes to form a conformal dielectric coating over all exposed surfaces of the substrate. During curing, the layer of coating may thin and spread to cover corners 30 and 32 of the core edge 24.

The dielectric coating is applied to all exposed surfaces of the core within the opening to form a conformal coating thereon. As used herein, a "conformal" film or coating refers to a film or coating having a substantially uniform thickness which conforms to a substrate topography. The dielectric coating film 28 thickness may be no more than about 50 microns, usually no more than about 25 microns, and typically no more than about 20 microns. A lower film thickness is desirable for a variety of reasons. For example, a dielectric coating having a low film thickness allows for smaller size vias.

The electrodeposited dielectric coating can have a dielectric constant of no more than 4.00, sometimes no more than about 3.50, often no more than about 3.30, usually no more than about 3.00, and typically no more than about 2.80. Also, the cured film typically can have a dielectric loss factor of less than or equal to about 0.02, usually less than or equal to about 0.15, and can be less than or equal to about 0.01. Also, a material having a low dielectric constant can allow for a dielectric coating having lower film.

A dielectric material is a non-conducting substance or insulator. The "dielectric constant" is an index or measure of the ability of a dielectric material to store an electric charge. The dielectric constant is directly proportional to the capacitance of a material, which means that the capacitance is reduced if the dielectric constant of a material is reduced. A low dielectric material is desired for high frequency, high speed digital application where the capacitances of substrates and coatings are critical to the reliable functioning of circuits. For example, present computer operations are limited by coupling capacitance between circuit paths and integrated circuits on multi-layer assemblies since computing speed between integrated circuits is reduced by this capacitance and the power required to operate is increased.

After application of the dielectric coating, further processing can include the circuitization of one or both of the insulating layers, and the formation of an electrical conductor in the opening. In one example, the opening can be filled with a conductive material, such as copper. Such conductive material would be electrically insulated from the core layer by the electrodeposited dielectric material.

Figure 7:
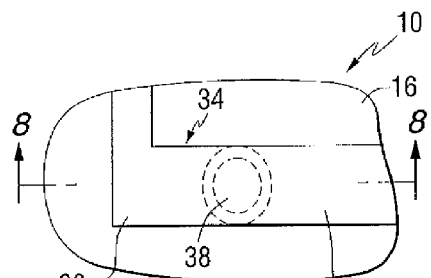
FIG. 7 is a cross-sectional view of the substrate of FIG. 6, taken along line 7-7.
Figure 8:
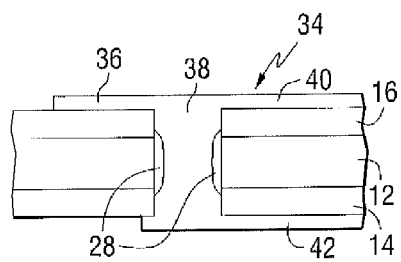
FIG. 8 is a plan view of another circuitized substrate.

FIG. 7 is a plan view of a circuitized substrate. FIG. 8 is a cross-sectional view of the substrate of FIG. 7, taken along line 8-8. In the example of FIGS. 7 and 8, a circuit 34 including conductor sections 36, 38, 40 and 42 is formed on the substrate. Conductor 38 fills the opening and is insulated from the core layer by the electrodeposited material.

Circuitization can be applied using known techniques. For example, a conductive layer can be applied to the layer of dielectric material and a layer of resist can be applied to the conductive layer. Then the resist is patterned and portions of the conductive layer are removed to leave the circuit conductors. Next, the resist is stripped off, exposing the circuit conductors.

Additional conductors or contacts can be formed by chemical, mechanical or laser ablating or using masking technologies to prevent coating application at selected areas or otherwise removing portions of the dielectric coating in a predetermined pattern to expose sections of the electrically conductive core, and applying a layer of metal to portions of the dielectric coating to form conductors and contacts. Metallization of at least one of the dielectric coating layers can also be used to form contacts and conductors adjacent to the surface of the dielectric coating layers.

Metallization typically is performed by applying a layer of metal to all surfaces, allowing for the formation of metallized vias through the substrate (i.e., through vias) and/or to (but not through) the core (i.e., blind vias). The thickness of the metal layer is typically about 5 to 50 microns.

To enhance the adhesion of the metal layer to the dielectric coating prior to the metallization step, all surfaces can be treated with an ion beam, electron beam, corona discharge or plasma bombardment, followed by the application of an adhesion promoter layer to all surfaces. The adhesion promoter layer can have a thickness ranging from 50 to 5000 Angstroms, and typically is a metal or metal oxide selected from chromium, titanium, nickel, cobalt, cesium, iron, aluminum, copper, gold, tungsten and zinc, and alloys and oxides thereof.

After metallization, a photosensitive layer formed from a photoresist (or resist) composition can be applied to the metal layer. Optionally, prior to the application of the photosensitive layer, the metallized substrate can be cleaned and pre-treated, e.g., treated with an acid etchant to remove oxidized metal. The photosensitive layer can be a positive or negative photosensitive layer. The photosensitive layer typically has a thickness of about 2 to about 50 microns and can be applied by any method known to those skilled in the photolithographic processing art. Additive or subtractive processing methods may be used to create the desired circuit patterns.

Suitable positive-acting photosensitive resins include any of those known to practitioners skilled in the art. Examples include dinitro-benzyl functional polymers. Such resins have a high degree of photosensitivity. In one example, the resinous photosensitive layer is a composition comprising a dinitro-benzyl functional polymer, typically applied by spraying. Nitrobenzyl functional polymers are also suitable.

The photosensitive layer can also be an electrodepositable composition comprising a dinitrobenzyl functional polyurethane and an epoxy-amine polymer.

Negative-acting photoresists include liquid or dry-film type compositions. Liquid compositions may be applied by rolling application techniques, curtain application, or electrodeposition. Preferably, liquid photoresists are applied by electrodeposition, more preferably cationic electrodeposition. Electrodepositable compositions comprise an ionic, polymeric material, which may be cationic or anionic, and may be selected from polyesters, polyurethanes, acrylics, and polyepoxides.

After the photosensitive layer is applied, a photo-mask having a desired pattern may be placed over the photosensitive layer and the layered substrate exposed to a sufficient level of a suitable actinic radiation source. As used herein, the term "sufficient level of actinic radiation" refers to that level of radiation which polymerizes the monomers in the radiation-exposed areas in the case of negative-acting resists, or which depolymerizes the polymer or renders the polymer more soluble in the case of positive-acting resists. This results in a solubility differential between the radiation-exposed and radiation-shielded areas.

The photo-mask may be removed after exposure to the radiation source and the layered substrate developed using conventional developing solutions to remove more soluble portions of the photosensitive layer, and uncover selected areas of the underlying metal layer. The metal, which is uncovered during this step, may then be etched using metal etchants that convert the metal to water-soluble metal complexes. The soluble complexes may be removed by water spraying.

The photosensitive layer protects any metal under it during the etching step. The remaining photosensitive layer, which is impervious to the etchants, may then be removed by a chemical stripping process to provide a circuit pattern connected by the metallized vias formed as described above.

After preparation of the circuit pattern on the substrate, other circuit components may be attached in one or more subsequent steps to form a circuit assembly. Additional components can include one or more multi-layer circuit assemblies prepared by any of the processes described above, smaller scale components (such as semiconductor chips), interposer layers, larger scale circuit cards or motherboards, and active or passive components. Components may be attached using conventional adhesives, surface mount techniques, wire bonding or flip chip techniques.

In another example, one or more electrical conductors can be formed on the walls of the opening. Such conductors would be electrically insulated from the core layer by the electrodeposited dielectric material.

FIG. 9 is a plan view of another circuitized substrate 50. FIG. 10 is a cross-sectional view of the substrate of FIG. 9, taken along line 10-10. In the example of FIGS. 9 and 10, a circuit 52 including conductor sections 54, 56, 58, 60 and 62 is formed on the substrate. Conductors 56 and 58 are positioned adjacent to a wall 64 of the opening and are insulated from the core layer by the electrodeposited material 28.

FIG. 11 is a plan view of another substrate 70 including an opening 82 passing through the substrate. FIG. 12 is a cross-sectional view of the substrate of FIG. 11, taken along line 12-12. The substrate 70 includes all electrically conductive core 72 and first and second layers of electrically insulating dielectric material 74 and 76 on opposite major surfaces 78 and 80 of the core. The core can have a thickness as low as about 5 µm.

The opening 82 can be created using any known technique, as described above. The opening may have a circular cross-sectional shape with a diameter of for example, about 25 µm, or another cross-sectional shape. The opening exposes an edge 84 of the conductive core.

To minimize potential blocking of the vias, the core may be recessed with an acid etch prior to application of the electrodeposited coating dielectric. Alternatively, if the via is blocked with unreacted electrodeposited coating, the via could be opened with a pressurized water spray prior to baking or laser etching after baking.

In this example, a portion of the edge 84 of the core is removed to create a recess having a depth D1. The portion can be removed by etching the exposed edge of the core. The etching can be accomplished, using an acid etchant for example, an HCl/CuCl$_x$/H$_2$O$_2$ mix (where x=1, 2) at a pH of about 1.5. The exact composition of each component will vary depending on whether the solution is fresh or at an adjusted equilibrium. The amount of etching has been shown to be proportional to the speed at which the substrate passes through the solution. Thus if the substrate passes through the etch solution, for example on a conveyor, the amount of etching is tunable by changing the speed of the conveyor. Different etchants can be used for different substrate core materials.

Following the etching, the edge of the core is recessed a distance D1 from the wall 86 of the opening. Then a Layer of dielectric material can be formed on the edge of the core using any of the previously described processes and materials. In one example, the ratio of the thickness of the core to the etch distance D1 is about 2.

FIG. 13 is a plan view of the substrate 70. FIG. 14 is a cross-sectional view of the substrate of FIG. 13, taken along line 14-14. The dielectric coating 88 can be applied to the exposed edge using electrodeposition. The surface 90 of the dielectric layer can be aligned with the wall 86 of the opening as shown in FIG. 14. To achieve conformance of the surface of the dielectric layer and the wall, the opening can be reamed or otherwise processed using techniques similar to those used to make the opening. For example, the opening could be drilled a second time, or the opening could be further shaped using a plasma etch or other material removal technique. In other examples, the surface of the dielectric layer can be recessed with respect to the wall 86, or it can protrude into the opening.

FIG. 15 is a plan view of a circuitized substrate. FIG. 16 is a cross-sectional view of the substrate of FIG. 15, taken along line 16-16. In the example of FIGS. 15 and 16, a circuit 100 including conductor sections 102, 104, 106 and 108 is formed on the substrate. Conductor 104 fills the opening and is insulated from the core layer by the electrodeposited material 88.

In another example, one or more electrical conductors can be formed on the walls of the opening, as shown in FIGS. 9 and 10. Such conductors would be electrically insulated from the core layer by the electrodeposited dielectric material.

Figure 17:
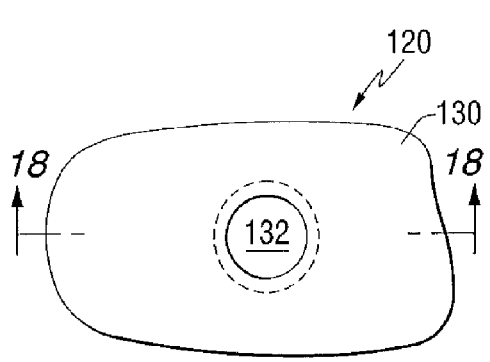
FIG. 17 is a plan view of a multi-layer substrate.
Figure 18:
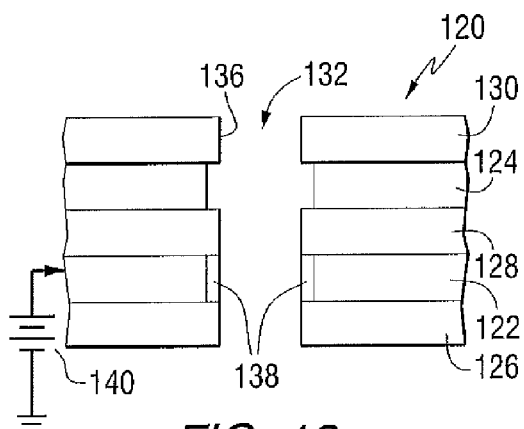
FIG. 18 is a cross-sectional view of the substrate of FIG. 17, taken along line 18-18.

FIG. 17 is a plan view of a multi-layer substrate 120. FIG. 18 is a cross-sectional view of the substrate of FIG. 17, taken along line 18-18. The substrate includes first and second conductive cores 122 and 124, and first, second and third layers of insulating material 126, 128 and 130. An opening 132 is formed in the substrate using the techniques described above. In this example, both cores are recessed from a wall 136 of the opening. A dielectric coating 138 can be selectively electrodeposited on one of the cores 122 by applying voltage to only that core as illustrated by voltage source 140. This example illustrates the use of multiple cores, where only selected ones of the cores include an electrodeposited coating on the edge adjacent to the opening. Following electrodeposition of the dielectric coating, the opening could be reamed to align the surface of the dielectric coating with the wall of the opening. In another example, the edges of the cores may be unetched, such that they are aligned with the wall of the opening.

Figure 19:
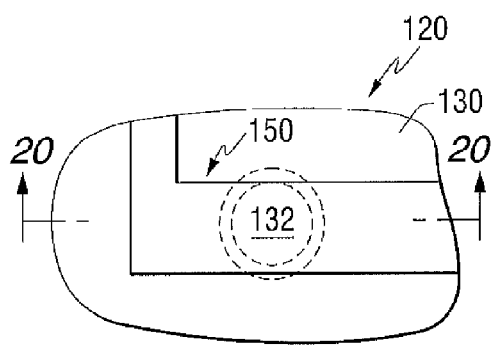
FIG. 19 is a plan view of a circuitized substrate.
Figure 20:
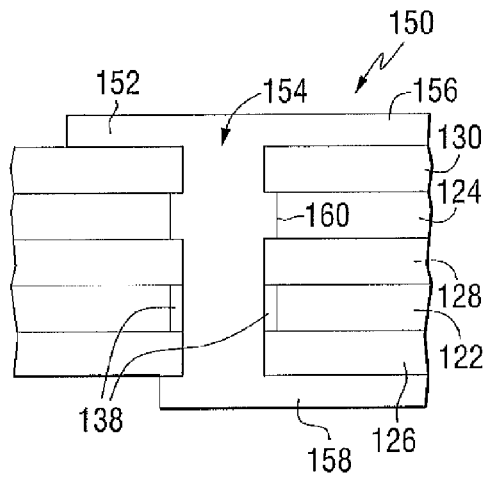
FIG. 20 is a cross-sectional view of the substrate of FIG. 19, taken along line 20-20.

FIG. 19 is a plan view of a circuitized substrate 120. FIG. 20 is a cross-sectional view of the substrate of FIG. 19, taken along line 20-20. FIGS. 19 and 20, a circuit 150 including conductor sections 152, 154, 156 and 158 is formed on the substrate. Conductor 154 is positioned in the opening and insulated from the core 122 layer by the electrodeposited material 138. The conductor section 154 makes electrical contact with the core 124 at edge 160. The structure of FIGS. 19 and 20 shows that the substrate can include multiple cores and the edges of the cores can be selectively coated with the dielectric coating, thereby allowing electrical contact between a conductor in the via and the edges of the cores which have not been coated.

Figure 21:
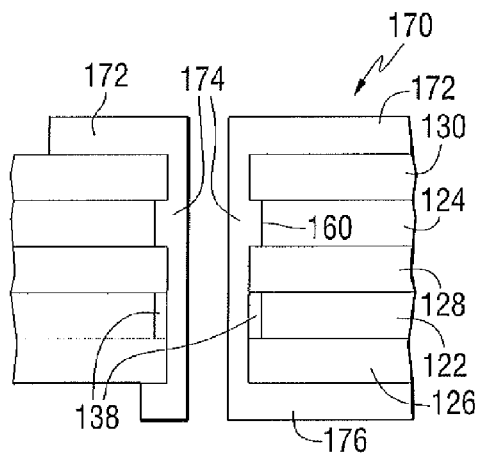
FIGS. 21 and 22 are cross-sectional view of other substrates in accordance with aspects of the invention.
Figure 22:
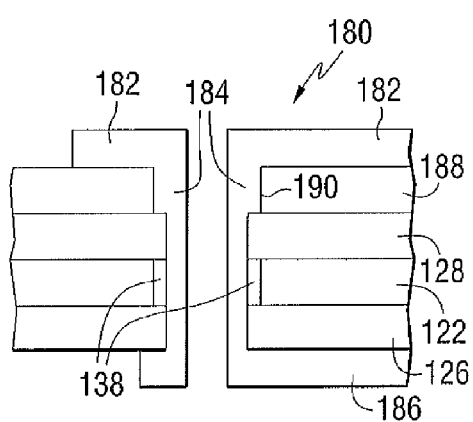

FIGS. 21 and 22 are cross-sectional views of other substrates in accordance with aspects of the invention. In FIG. 21 a circuit 170 including conductor sections 172, 174 and 176 is formed on the substrate. Conductor section 174 is positioned along the wall of the opening and insulated from the core 122 layer by the electrodeposited material 138. The conductor section 174 makes electrical contact with the core 124 at edge 160.

In FIG. 22 a circuit 180 including conductor sections 182, 184 and 186 is formed on the substrate. Conductor section 184 is positioned along the wall of the opening and insulated from the core 122 layer by the electrodeposited material 138. The conductor section 184 makes electrical contact with the conductive layer 188 at edge 190. FIG. 22 is similar to the structure of FIG. 23, but the second conductive core has been replaced by a conducive layer 188 and the top insulating layer has been removed.

Figure 23:
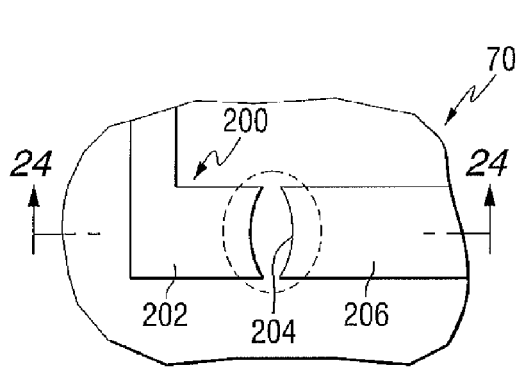
FIG. 23 is a plan view of another circuitized substrate.
Figure 24:
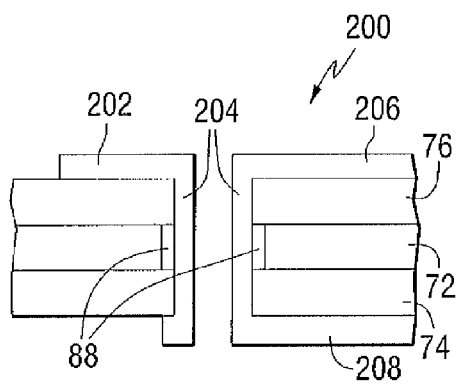
FIG. 24 is a cross-sectional view of the substrate of FIG. 23, taken along line 24-24.

FIG. 23 is a plan view of another circuitized substrate. FIG. 24 is a cross-sectional view of the substrate of FIG. 23, taken along line 24-24. In the example of FIGS. 23 and 24, a circuit 200 including conductor sections 202, 204, 206 and 208 is formed on the substrate. Conductor section 204 is positioned along the sides of the opening and is insulated from the core layer by the electrodeposited material 88.

In another example, the dielectric coating can be removed in one or more predetermined locations to expose one or more sections of the edge of the core. The dielectric coating can be removed by a variety of methods, for example by ablation techniques. Such ablation typically is performed using a laser or by other conventional techniques, for example, mechanical drilling and chemical or plasma etching techniques.

In another aspect, the invention is directed to a process for fabricating a substrate assembly comprising: providing a substrate (such as any of those described in detail above) including a conductive core and first and second insulating layers on opposite sides of the core, forming an opening in the substrate to expose an edge of the conductive core, and electrodepositing a dielectric coating (such as any of those described in detail above) onto the exposed edge of the core.

The process can further include the step of removing a portion of the conductive core adjacent to the edge prior to applying the dielectric coating. The dielectric coating can be recessed from a wall of the opening, aligned with the wall, or protruding from the wall. To align the surface of the dielectric coating with the wall, the opening can be reamed.

In various aspects, the invention allows the use of current processing techniques for much of the substrate fabrication, while providing a method that allows for small via sizes. In one aspect, the invention can include a method for preventing blocking of the vias with the electrodeposited coating (especially with small diameter vias) or the removal of extraneous coating. Besides the advantage of obtaining metal core technology using proven laminating processes, smaller diameter (<100 microns), more tightly packed vias could potentially be produced. This benefit can be obtained with minimal changes in current production process.

It should be understood that any of the processes of the present invention can include one or more additional steps without departing from the scope of the invention. Likewise, the order in which the steps are performed may be changed as necessary, without departing from the scope of the invention.

As used in this description, unless indicated to the contrary, the numerical parameters are approximations that may vary depending upon the desired properties sought to be obtained by the present invention. Thus each numerical parameter should at least be construed in light of the number of reported significant digits and by applying ordinary rounding techniques, or by taking typically manufacturing tolerances into account.

Other than in the operating examples, or where otherwise indicated, all numbers expressing dimensions, quantities of ingredients, processing parameters and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical values, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between and including the recited minimum value of 1 and the recited maximum value of 10, that is, having a minimum value equal to or greater than 1 and a maximum value equal to or less than 10.

It will be appreciated by those skilled in the art that changes could be made to the embodiments described above without departing from the broad inventive concept thereof. It is understood, therefore, that this invention is not limited to the particular embodiments disclosed, but it is intended to cover modifications which are within the spirit and scope of the invention, as defined by the appended claims.

What is claimed is:

1. A process for fabricating a circuit board comprising:
   providing a substrate including a first electrically conductive core having a first insulating coating on a first side and a second insulating coating on a second side;
   forming an opening in the first and second insulating coatings and the first electrically conductive core, exposing an edge of the conductive core within the opening;
   using an acid etch comprising an $HCl/CuCl_x/H_2O_2$ mix, where x is 1 or 2 at a pH of about 1.5 to remove a portion of the conductive core to create a recessed edge of the conductive core in a cavity in a wall of the opening; and
   electrodepositing a third insulating material on the exposed edge of the first electrically conductive core.

2. The process of claim 1, further comprising:
   reaming the opening.

3. The process of claim 1, wherein the substrate includes a second electrically conductive core, electrically insulated from the first electrically conductive layer, and the process further comprises:
   filling the opening with a conductive material, wherein the conductive material is electrically insulated from the first conductive core by the third insulating material, and electrically connected to the second electrically conductive layer.

4. The process of claim 1, wherein the third insulating material comprises:
   a cathodic epoxy.

5. The process of claim 1, wherein the third insulating material comprises:
   resinous phase dispersed in an aqueous medium, where the resinous phase has a covalently bonded halogen content of at least 1 percent by weight based on total weight of resin solids present in said resinous phase.

6. The process of claim 1, wherein the third insulating material comprises:
   a water dispersible polymer including a cationic functional group to impart a positive charge.

7. The process of claim 6, wherein the cationic functional group comprises a cationic salt group.

8. The process of claim 7, wherein the cationic salt group comprises a cationic amine salt group.

9. The process of claim 1, wherein the third insulating material comprises:
   an active hydrogen-containing ionic electrodepositable resin.

10. The process of claim 9, wherein the active hydrogen-containing ionic electrodepositable resin is cationic and capable of deposition on a cathode.

11. The process of claim 9, wherein the active hydrogen-containing ionic electrodepositable resin comprises a cationic salt group-containing polymer.

12. The process of claim 11, wherein the resin is a reaction product of an epoxy functional material with a halogenated phenol followed by reaction of any residual epoxy groups with an amine.

13. The process of claim 12, wherein the reaction product is solubilized with an acid.

14. The process of claim 9, wherein the active hydrogen-containing ionic electrodepositable resin comprises an amine salt group-containing resin.

15. The process of claim 14, wherein the amine salt group-containing resin comprises an acid-solubilized reaction product of polyepoxides and primarily or secondary amines.

16. The process of claim 9, wherein the active hydrogen-containing ionic electrodepositable resin comprises about 10 to about 70 percent by weight of the electrodepositable coating.

17. The process of claim 1, wherein the third insulating material comprises:
a resin which cures via transesterification.

18. The process of claim 17, wherein the resin comprises cationic salt groups.

19. The process of claim 18, wherein the resin is formed by solubilizing the film-forming resin with an inorganic or organic acid.

20. The process of claim 18, wherein the resin is formed by solubilizing the film-forming resin with a sulfamic acid.

21. The process of claim 1, wherein the third insulating material comprises:
a resin derived from a halogenated compound selected from at least one of a halogenated phenol, or a brominated bisphenol.

22. The process of claim 21, wherein the brominated bisphenol comprises tetrabromobisphenol A.

23. The process of claim 1, wherein the third insulating material comprises:
an ionic electrodepositable resin and a curing agent adapted to react with the active hydrogens of the resin.

24. The process of claim 1, wherein the third insulating material further comprises a rheology modifier.

25. The process of claim 24, wherein the rheology modifier comprises a cationic microgel dispersion prepared by dispersing in aqueous medium a mixture of a cationic polyepoxide-amine reaction product which contains amine groups.

26. The process of claim 25, wherein the amine groups comprise primary amine groups, secondary amine groups or mixtures thereof, and a polyepoxide crosslinking agent.

27. The process of claim 25, further comprising:
heating the third insulating material to a temperature sufficient to crosslink the third insulating material, thus forming a cationic microgel dispersion.

28. The process of claim 27, wherein the microgel is present in a resinous phase of the third insulating material in an amount ranging from about 1 to about 20 weight percent based on weight of total resin solids.

29. The process of claim 1, wherein the third insulating material comprises a clear resin feed, which includes an active hydrogen-containing ionic electrodepositable resin.

30. The process of claim 29, wherein the resin comprises a film-forming polymer, a curing agent, and a catalyst.

31. The process of claim 29, wherein the resin comprises a substantially pigment-free, one-component composition.

32. The process of claim 1, wherein the third insulating material comprises an aqueous medium including a coalescing solvent.

33. The process of claim 32, wherein the coalescing solvent includes monobutyl or monohexyl ethers of ethylene glycol.

34. The process of claim 1, wherein the third insulating material is applied using a voltage of about 50 and about 500 volts.

35. The process of claim 1, further comprising:
curing the third insulating material at temperatures ranging from about 90° to about 300° C. for a period of 1 to 40 minutes.

36. The process of claim 1, wherein the third insulating material has a dielectric constant of no more than about 3.50.

37. The process of claim 1, wherein the opening has a diameter of less than about 200 microns.

\* \* \* \* \*

UNITED STATES PATENT AND TRADEMARK OFFICE
CERTIFICATE OF CORRECTION

PATENT NO.        : 7,743,494 B2                                              Page 1 of 1
APPLICATION NO.   : 11/972671
DATED             : June 29, 2010
INVENTOR(S)       : Alan E. Wang et al.

It is certified that error appears in the above-identified patent and that said Letters Patent is hereby corrected as shown below:

Claims

Claim 15; Column 16, Line 67
"primarily" should read "primary"

Signed and Sealed this
Twenty-fifth Day of September, 2012

David J. Kappos
*Director of the United States Patent and Trademark Office*